United States Patent
Yonemochi et al.

(10) Patent No.: US 9,184,106 B2
(45) Date of Patent: Nov. 10, 2015

(54) HEAT SINK AND SEMICONDUCTOR DEVICE

(71) Applicant: SHINKO ELECTRIC INDUSTRIES CO., LTD., Nagano (JP)

(72) Inventors: Masahiro Yonemochi, Nagano (JP); Kesayuki Takeuchi, Nagano (JP); Shuji Negoro, Nagano (JP); Masafumi Seki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/547,347

(22) Filed: Nov. 19, 2014

(65) Prior Publication Data

US 2015/0214131 A1 Jul. 30, 2015

(30) Foreign Application Priority Data

Jan. 30, 2014 (JP) ................................. 2014-015834

(51) Int. Cl.
| | |
|---|---|
| H01L 23/495 | (2006.01) |
| H01L 23/367 | (2006.01) |
| H01L 23/42 | (2006.01) |
| H01L 23/492 | (2006.01) |
| H01L 23/36 | (2006.01) |
| H01L 21/48 | (2006.01) |

(52) U.S. Cl.
CPC ........ *H01L 23/3675* (2013.01); *H01L 21/4878* (2013.01); *H01L 23/36* (2013.01); *H01L 23/42* (2013.01); *H01L 23/492* (2013.01); *H01L 2924/0002* (2013.01)

(58) Field of Classification Search
CPC .... H01L 23/3675; H01L 23/42; H01L 23/492
See application file for complete search history.

(56) References Cited

FOREIGN PATENT DOCUMENTS

JP 2005-034857 2/2005

*Primary Examiner* — Long Pham
(74) *Attorney, Agent, or Firm* — IPUSA, PLLC (57) ABSTRACT

A heat sink includes a frame having an opening, the opening extending in a thickness direction of the frame, the opening having a first opening part and a second opening part, the second opening part being larger than the first opening part in a plan view perpendicular to the thickness direction, a wall standing on the frame at an edge of the opening, a groove formed in the frame beside the wall, and a plate member including a first plate disposed in the first opening part and a second plate disposed in the second opening part and larger than the first plate in the plan view, wherein the second opening part is larger than the second plate in the plan view to leave a gap therebetween, and the wall is bent toward the opening to be in contact with an edge along a perimeter of the second plate.

8 Claims, 11 Drawing Sheets

HEAT SINK AND SEMICONDUCTOR DEVICE

CROSS-REFERENCE TO RELATED APPLICATIONS

The present application is based upon and claims the benefit of priority from the prior Japanese Patent Application No. 2014-015834 filed on Jan. 30, 2014, with the Japanese Patent Office, the entire contents of which are incorporated herein by reference.

FIELD

The disclosures herein relate to a heat sink and a semiconductor device.

BACKGROUND

A swage member is fastened at an end thereof to another member by swaging. Such a swage member includes, at the end thereof, a shape retaining part having a shape retaining surface whose shape needs to be retained, a swage part to be swaged, and a groove disposed between the swage part and the shape retaining part to prevent the shape retaining surface from being deformed (see Japanese Patent Application Publication No. 2005-034857, for example).

A conventional swage member has a portion thereof plastically deformed toward a counterpart member to provide a swage engagement so that the swage member partly covers the surface of the counterpart member. With this arrangement, sufficient area size for mounting cannot be secured for the purpose of mounting another member, a device, or the like on such a surface. Such a lack of mounting area size results in a failure to provide sufficient cooling performance when the swage member is used in a heat sink, for example.

Accordingly, it may be desired to provide a heat sink and a semiconductor device that have sufficient area size for mounting and that exhibit sufficient cooling performance.

SUMMARY

It is a general object of the present invention to provide a heat sink and a semiconductor device that substantially obviate one or more problems caused by the limitations and disadvantages of the related art.

According to an embodiment, a heat sink includes a frame member and a plate member, wherein the frame member includes a frame having an opening, the opening extending in a thickness direction of the frame from a first side of the frame to a second side of the frame, the opening having a first opening part situated toward the first side and a second opening part situated toward the second side, the second opening part being larger than the first opening part in a plan view perpendicular to the thickness direction of the frame, a wall standing on the frame on the second side at an edge of the opening, and a groove formed in the frame beside the wall on an opposite side of the wall from the opening side, wherein the plate member is disposed in the opening, and includes a first plate part disposed in the first opening part and a second plate part disposed in the second opening part and being larger than the first plate part in the plan view, and wherein the second opening part is larger than the second plate part in the plan view to leave a gap between an outer side surface of the second plate part and an inner surface of the second opening part, and the wall is bent toward the opening to be in contact with an edge along a perimeter of the second plate part.

According to an embodiment, a heat sink includes a frame member and a plate member, wherein the frame member includes a frame having an opening, the opening extending in a thickness direction of the frame from a first side of the frame to a second side of the frame, the opening having a first opening part situated toward the first side and a second opening part situated toward the second side, the second opening part being larger than the first opening part in a plan view perpendicular to the thickness direction of the frame, a wall standing on the frame on the second side at an edge of the opening, and a groove formed in the frame beside the wall on an opposite side of the wall from the opening side, wherein the plate member is disposed in the opening, and includes a first plate part disposed in the first opening part and a second plate part disposed in the second opening part and being larger than the first plate part in the plan view, and wherein the second opening part is larger than the second plate part in the plan view to leave a gap between an outer side surface of the second plate part and an inner surface of the second opening part, and the wall is bent toward the opening to be engaged with the outer side surface of the second plate part.

According to an embodiment, a semiconductor device includes a heat sink, an interconnection substrate, and a semiconductor chip mounted on the interconnection substrate, wherein the heat sink includes a frame member and a plate member, wherein the frame member includes a frame having an opening, the opening extending in a thickness direction of the frame from a first side of the frame to a second side of the frame, the opening having a first opening part situated toward the first side and a second opening part situated toward the second side, the second opening part being larger than the first opening part in a plan view perpendicular to the thickness direction of the frame, a wall standing on the frame on the second side at an edge of the opening, and a groove formed in the frame beside the wall on an opposite side of the wall from the opening side, wherein the plate member is disposed in the opening, and includes a first plate part disposed in the first opening part and a second plate part disposed in the second opening part and being larger than the first plate part in the plan view, wherein the second opening part is larger than the second plate part in the plan view to leave a gap between an outer side surface of the second plate part and an inner surface of the second opening part, and the wall is bent toward the opening to be in contact with an edge along a perimeter of the second plate part, and wherein a surface of the semiconductor chip opposite from the interconnection substrate is attached to a surface of the second plate part exposed from the second opening part.

According to at least one embodiment, a heat sink and a semiconductor device are provided that exhibit sufficient cooling performance.

BRIEF DESCRIPTION OF DRAWINGS

Other objects and further features of the present invention will be apparent from the following detailed description when read in conjunction with the accompanying drawings, in which.

DESCRIPTION OF EMBODIMENTS

In the following, embodiments to which a heat sink and a semiconductor device of the present disclosure are applied will be described.

Figure 1A:
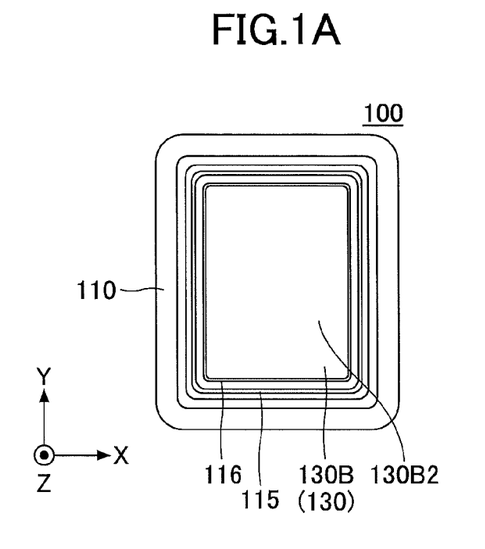
FIGS. 1A and 1B are drawings illustrating a heat sink according to an embodiment.
Figure 1B:
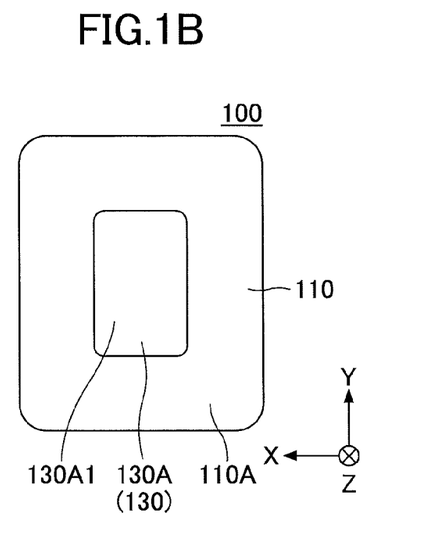
Figure 2A:
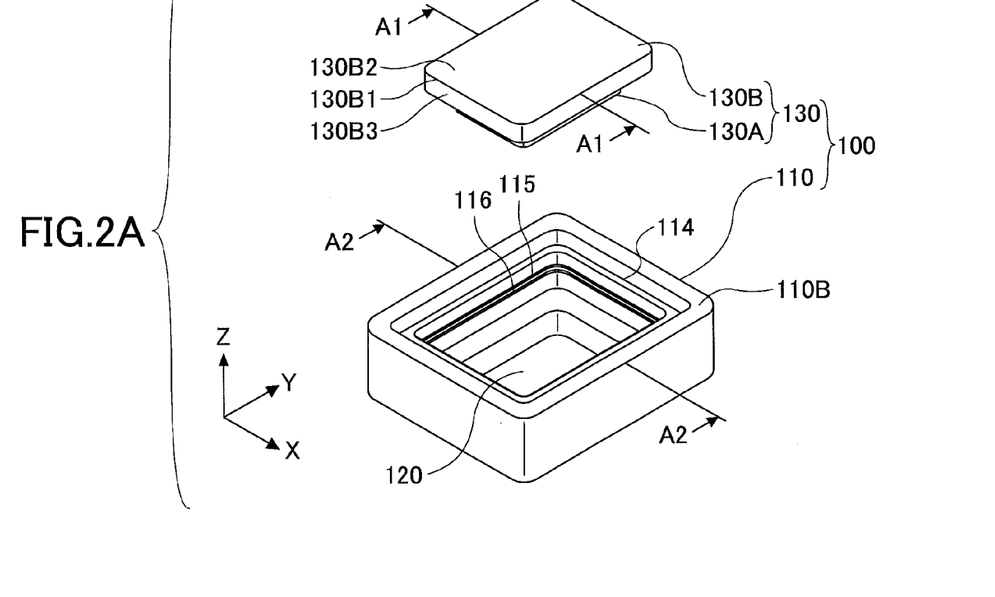
FIGS. 2A and 2B are oblique perspective views of the heat sink of the embodiment.
Figure 2B:
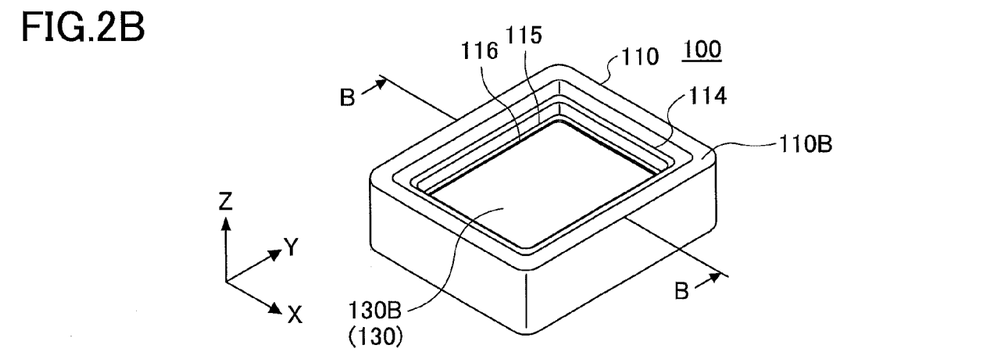
Figure 3A:
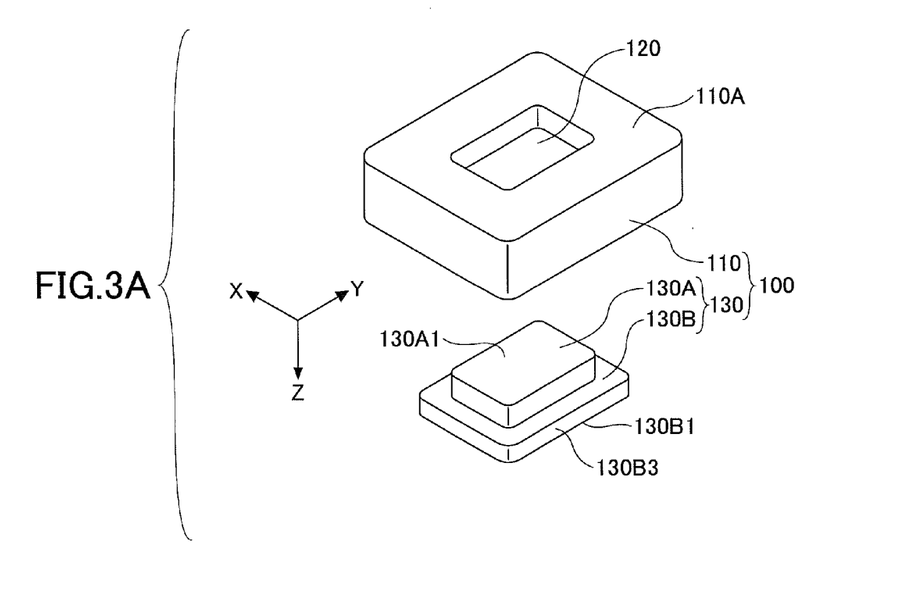
FIGS. 3A and 3B are oblique perspective views of the heat sink of the embodiment.
Figure 3B:
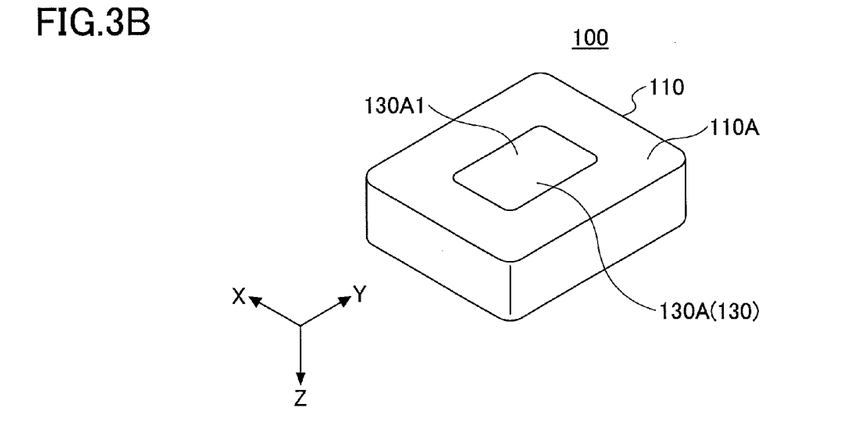

FIGS. 1A and 1B are drawings illustrating a heat sink 100 according to an embodiment. FIG. 1A depicts a top plan view, and FIG. 1B depicts a bottom plan view. FIGS. 2A and 2B as well as FIGS. 3A and 3B are oblique perspective views of the heat sink 100. FIG. 2A and FIG. 3A are oblique perspective views illustrating the heat sink 100 in an exploded view. FIG. 2B and FIG. 3B are oblique perspective views illustrating the heat sink 100 in an assembled state.

Figure 4A:
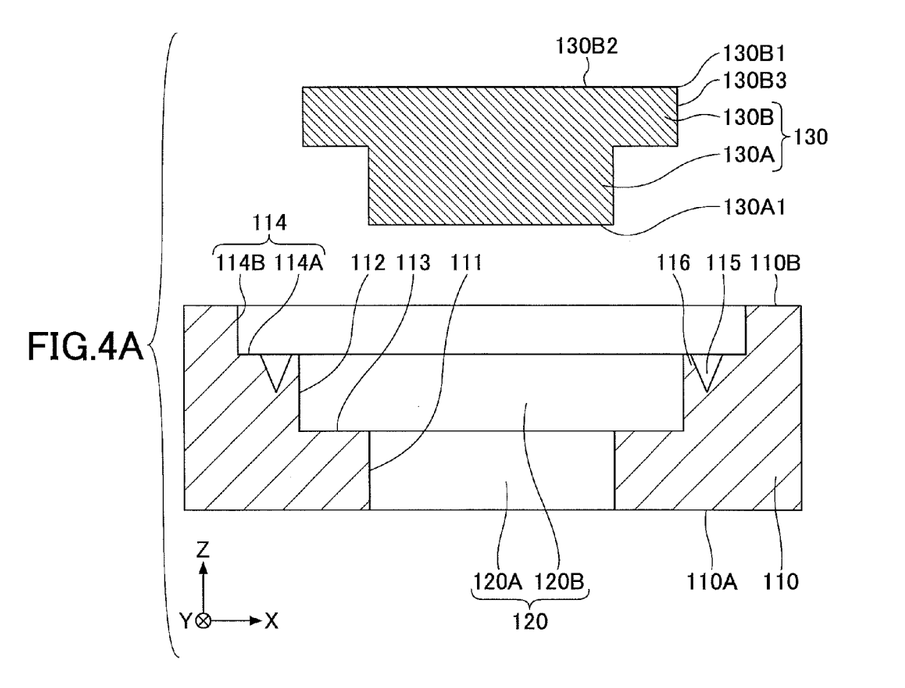
FIGS. 4A and 4B are cross-sectional views of the heat sink of the embodiment.
Figure 4B:
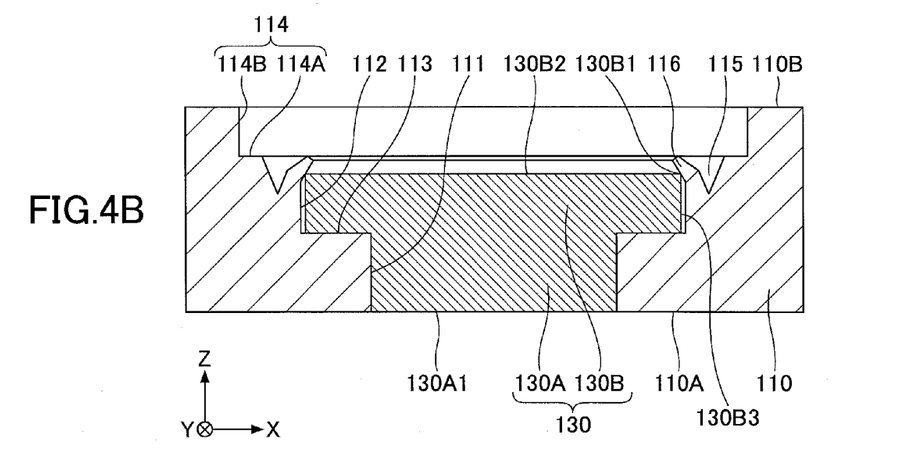

FIGS. 4A and 4B are cross-sectional views of the heat sink 100. FIG. 4A illustrates the cross sections taken along the line A1-A1 and the line A2-A2 in FIG. 2A. FIG. 4B illustrates the cross section taken along the line B-B in FIG. 2B. In FIGS. 1A and 1B through FIGS. 4A and 4B, an XYZ coordinate system, which is an orthogonal coordinate system, is defined as illustrated.

The heat sink 100 includes a frame member 110 and a plate 130.

The frame member 110 includes inner circumferential surfaces 111 and 112, a connecting surface 113, a recessed part 114, a groove part 115, and a wall part 116. The frame member 110 is made of metallic material that has a higher degree of hardness than the metal used for the plate 130, and that has high spring property. The frame member 110 may be made of stainless steel.

The frame member 110 is a rectangular metallic plate as viewed from above, and has the recessed part 114 formed in one surface of the metallic plate (i.e., the surface facing the positive Z axis). An opening 120 is formed as a through-hole extending from a bottom surface 114A of the recessed part 114 to the opposite surface of the metallic plate (i.e., the surface facing the negative Z axis). The frame member 110 is an annular rectangle member as viewed from above.

The inner circumferential surfaces 111 and 112 define the opening 120 by enclosing the opening 120, and are connected to each other via the connecting surface 113 that is parallel to the X-Y plane. The inner circumferential surfaces 111 and 112 and the connecting surface 113 form a step.

The opening 120 includes an opening 120A and an opening 120B. The opening 120A is a void surrounded by the inner circumferential surface 111. The opening 120B is a void surrounded by the inner circumferential surface 112. The opening 120B is larger than the opening 120A as viewed from above (i.e., in a plan view). With this arrangement, the step formed by the inner circumferential surfaces 111 and 112 and the connecting surface 113 has an annular rectangle shape as viewed from above around the opening 120.

The recessed part 114 has the bottom surface 114A and a side surface 114B. The recessed part 114 is rectangular as viewed from above. The bottom surface 114A is larger than the opening 120B as viewed from above (i.e., in a plan view). The recessed part 114 is formed by performing a mechanical process such as cutting, for example, in the surface of the frame member 110 facing the positive Z axis. As a non-limiting example, the opening 120 may be made by forming a through hole in the bottom surface 114A of the recessed part 114 after the recessed part 114 is formed.

The groove part 115 is formed in the bottom surface 114A of the recessed part 114 to have an annular rectangle shape along the rectangle perimeter of the opening 120B as viewed from above. The groove part 115 has a V-letter shape in a cross-sectional view. The groove part 115 may be formed by performing a mechanical process such as cutting, for example.

The wall part 116 is formed between the inner circumferential surface 112 and the bottom surface 114A of the recessed part 114, and rises toward the positive Z axis. The wall part 116 is situated inside the groove part 115 that is formed in the bottom surface 114A as an annular rectangle groove as viewed from above. The wall part 116 has an annular rectangle shape as viewed from above in such a manner as to surround the opening 120B. The wall part 116 may be formed by making the groove part 115 in the bottom surface 114A of the recessed part 114 after the recessed part 114 is formed in the frame member 110, for example.

The opening 120 includes the opening 120A and the opening 120B as described above. The opening 120A is an example of a first opening, and the opening 120B is an example of a second opening. Further, part of the opening 120 situated toward the negative Z axis (i.e., the part formed in a surface 110A of the frame member 110) is an example of the first opening. Part of the opening 120 situated toward the positive Z axis (i.e., the part formed in the bottom surface 114A) is an example of the second opening.

A plate part 130A of the plate 130 is press fit into the opening 120A. A plate part 130B of the plate 130 is disposed in the opening 120B.

The plate 130 includes the plate part 130A and the plate part 130B. The plate part 130A and the plate part 130B are formed as a unitary, continuous part. The plate 130 is made of metal. The plate 130 may be formed by plating a nickel layer on the surface of a metal member made of copper, for example. The plate 130 may be made by forming a metal plate member, the surface of which is then coated with a nickel plated layer by an electrolytic plating process.

The plate part 130A is smaller than the plate part 130B as viewed from above (i.e., in a plan view). The plate part 130A is situated closer to the center than either end of the plate part 130B in the X-axis direction as illustrated in FIGS. 4A and 4B, and is also situated closer to the center than either end of the plate part 130B in the Y-axis direction. With this arrangement, the plate part 130A and the plate part 130B form a step, which corresponds to the step formed by the inner circumferential surfaces 111 and 112 and the connecting surface 113 of the frame member 110.

The lengths of the plate part 130A in the X-axis direction and in the Y-axis direction are slightly longer than the lengths of the opening 120A in the X-axis direction and in the Y-axis direction, respectively. This arrangement is made in order to fixedly mount the plate part 130A to, the frame member 110 by press fitting the plate part 130A into the opening 120A.

The thickness of the plate part 130A is equal to the depth of the opening 120A. The depth of the opening 120A is defined as the thickness of the frame member 110 from the surface 110A to the connecting surface 113. Upon press fitting the plate part 130A into the opening 120A from the direction of the positive Z axis, a surface 130A1 of the plate part 130A facing the negative Z axis becomes flush with the surface 110A of the frame member 110. Such a coplanar surface is formed for the purpose of mounting a member (e.g., a heat sink having fins disposed on the surface thereof) for dissipating the heat of a semiconductor device or the like on the coplanar surface (i.e., the surface 110A and the surface 130A1) of the heat sink 100 facing the negative Z axis.

The plate part 130B is larger than the plate part 130A and smaller than the opening 120B as viewed from above. Further, the thickness of the plate part 130B is slightly smaller than the distance between the connecting surface 113 and the bottom surface 114A in the thickness direction of the frame member 110. This arrangement is made due to the following reason. After inserting the plate 130 illustrated in FIG. 4A into the opening 120 of the frame member 110, the wall part 116 is bent toward inside the opening 120 (i.e., toward the center of the opening 120 as viewed from above). An upper part of the inner circumferential surface 112 is thus brought in contact with an upper edge 130B1 along the perimeter of the plate part 130B, so that the wall part 116 securely holds the plate part 130B. In order for the wall part 116 to hold the upper edge 130B1 as described above, the size of the plate part 130B as viewed from above and the thickness thereof are set as described above.

Due to the use of the configuration in which the wall part 116 is bent toward inside the opening 120, the plate part 130B is made smaller than the opening 120B as viewed from above (i.e., in a plan view). In the state in which the plate 130 is placed inside the opening 120, there is thus a gap between the plate part 130B and the inner circumferential surface 112 (see FIG. 4B).

The upper edge 130B1 refers to the intersection of a side surface 130B3 and a surface 130B2 of the plate part 130B situated opposite from where the plate part 130A is provided. The wall part 116 may hold the plate part 130B such that the wall part 116 is dented to some extent while the plate part 130B exhibits no deformation. In such a case, the upper edge 130B1 includes a portion (i.e., a portion of the surface 130B2 and a portion of the side surface 130B3) that is in contact with the dent formed in the wall part 116. Even in the case of the presence of such a dent in the wall part 116, the area size that is taken away by the dent from the surface 130B2 is miniscule and ignorable.

Conversely, the wall part 116 may hold the plate part 130B such that the upper edge along the perimeter of the plate part 130B is dented to some extent while the wall part 116 exhibits no deformation. In such a case, the upper edge 130B1 refers to a portion of the plate part 130B that is in contact with the wall part 116. The denting of the upper edge along the perimeter of the plate part 130B means a type of deformation that creates a bevel. In this case, the beveled part constitutes the upper edge 130B1. Even in the case of the presence of such a dent in the upper edge along the perimeter of the plate part 130B, the area size that is taken away by the dent from the surface 130B2 is miniscule and ignorable.

Both the wall part 116 and the upper edge along the perimeter of the plate part 130B may be dented. In such a case, the above-provided discussions regarding the case in which the wall part 116 is dented to some extent and the above-provided discussions regarding the case in which the upper edge along the perimeter of the plate part 130B is dented to some extent may both be taken into account.

Some examples of the dimensions of the frame member 110 and the plate 130 of the heat sink 100 described above are as follows.

The lengths of the frame member 110 in the X-axis direction and in the Y-axis direction are 35mm and 45 mm, respectively, with the thickness thereof (i.e., the length in the Z-axis direction) being 2.2 mm. The thickness of the frame member 110 from the surface 110A to the connecting surface 113 is 0.8 mm. The distance between the connecting surface 113 and the bottom surface 114A in the thickness direction of the frame member 110 is 1.0 mm. The distance between the bottom surface 114A and the surface 110B in the thickness direction of the frame member 110 is 0.4 mm. The depth of the groove part 115, i.e., the distance between the bottom point of the V-letter-shape groove and the bottom surface 114A, is 0.4 mm.

The lengths of the opening 120A in the X-axis direction and in the Y-axis direction are 28 mm and 38 mm, respectively, with the height thereof (i.e., the length in the Z-axis direction) being 0.8 mm. The lengths of the opening 120B in the X-axis direction and in the Y-axis direction are 29.2 mm and 39.2 mm, respectively, with the height thereof (i.e., the length in the Z-axis direction) being 1.0 mm.

The lengths of the plate part 130A in the X-axis direction and in the Y-axis direction are 28 mm and 38 mm, respectively, with the thickness thereof (i.e., the length in the Z-axis direction) being 0.8 mm. It may be noted that the lengths of the plate part 130A in the X-axis direction and in the Y-axis direction may be set longer than 28 mm and 38 mm, respectively, to the extent necessary for press fitting the plate part 130A into the opening 120A (X by Y=28 mm by 38 mm). An increase in the lengths for the purpose of press fitting may depend on what the metal materials and sizes of the plate 130 and the frame member 110 are. One example of such an increase is 0.1 mm.

The lengths of the plate part 130B in the X-axis direction and in the Y-axis direction are 29 mm and 39 mm, respectively, with the thickness thereof (i.e., the length in the Z-axis direction) being 0.7 mm. In the state in which the plate 130 is placed inside the opening 120 as illustrated in FIG. 4B, a gap (i.e., clearance) of 0.1 mm is present between the plate part 130B and the inner circumferential surface 112 in both the X-axis direction and the Y-axis direction. Further, the upper surface of the plate part 130B is 0.3 mm lower than the bottom surface 114A of the recessed part 114 of the frame member 110.

FIGS. 4A and 4B provide illustrations of the cross-sectional views of the frame member 110 and the plate 130 parallel to the X-Z plane. As is apparent from the descriptions provided above, the shapes of the cross-sections parallel to the Y-Z plane are the same as or similar to the shapes of the cross-sections parallel to the X-Z plane. The frame member 110 and the plate 130 are longer in the Y-axis direction than in the X-axis direction. The cross-sections parallel to the Y-Z plane are thus longer in the horizontal direction than are the cross-sections parallel to the X-Z plane illustrated in FIGS. 4A and 4B.

In the following, a description will be given of the process of bending the wall part 116 by referring to FIGS. 5A through 5C.

Figure 5A:
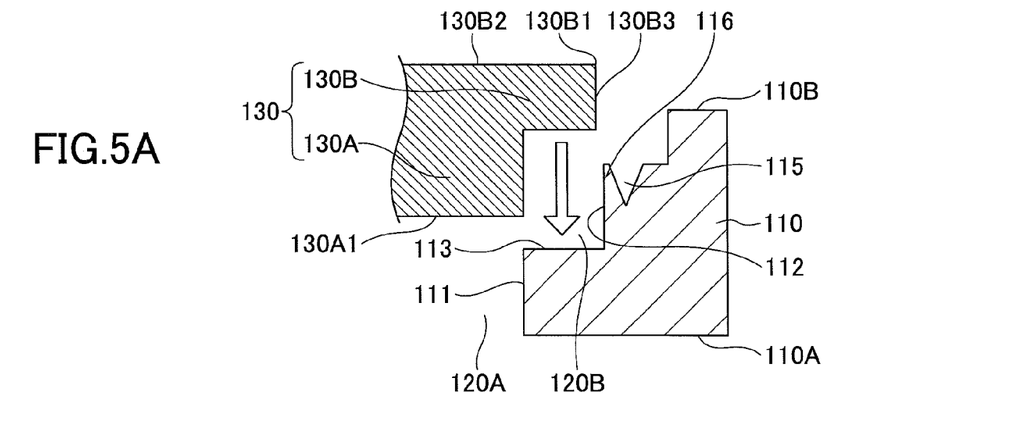
FIGS. 5A through 5C are drawings illustrating the process of securing a plate by use of a wall part of a frame member in the heat sink of the embodiment.
Figure 5B:
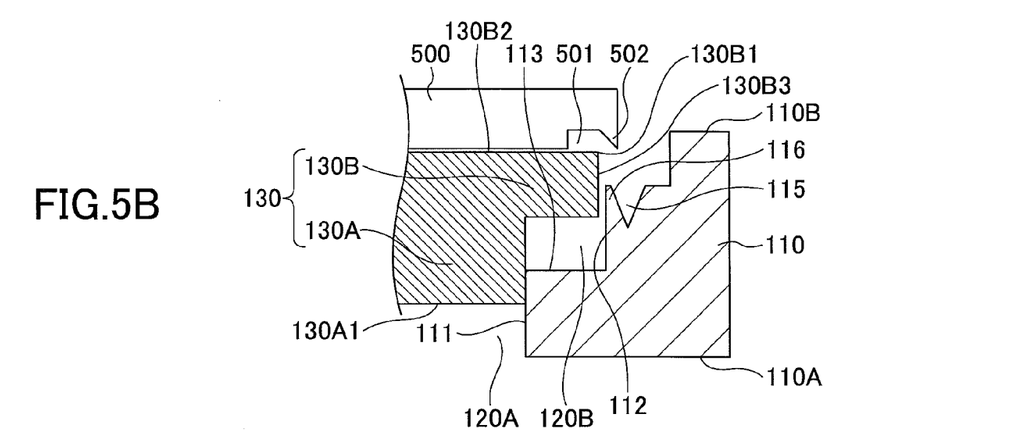
Figure 5C:
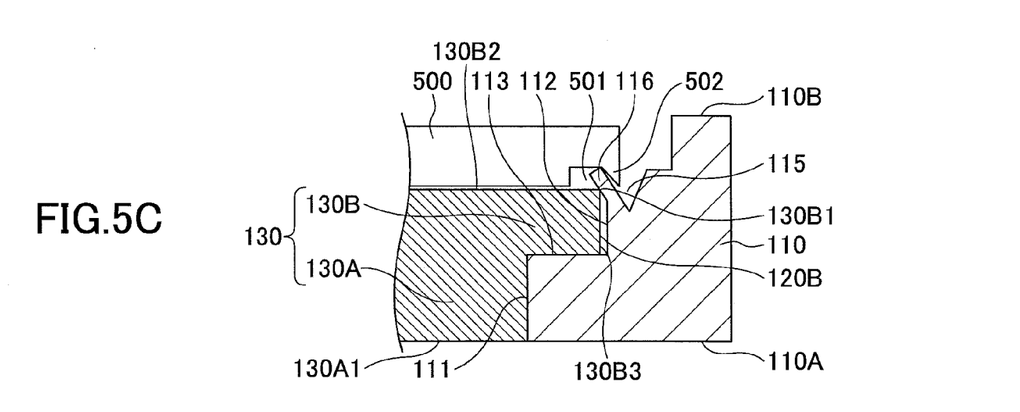

FIGS. 5A through 5C are drawings illustrating the process of securing the plate 130 by use of the wall part 116 of the frame member 110 in the heat sink 100 of the embodiment.

FIGS. 5A through 5C illustrate only the right-hand-side half of the frame member 110 and the plate 130 illustrated in FIGS. 4A and 4B.

As illustrated in FIG. 5A, the plate 130 is aligned with respect to the frame member 110, and the plate part 130A and the plate part 130B are inserted into the opening 120A and the opening 120B, respectively.

A punch 500 is thereafter used as illustrated in FIG. 5B. The punch 500 is a jig used to bend the wall part 116 in the state illustrated in FIG. 5B in the manner as illustrated in FIG. 5C. The punch 500 may be a plate-shaped member made of iron or super steel (e.g., an alloy of tungsten and carbide). The punch 500 includes a recessed part 501 and a projecting part 502 on the lower surface thereof as illustrated in FIG. 5B. The recessed part 501 is provided for the purpose of avoiding contact with the tip of the wall part 116. The projecting part 502 is positioned such that the projecting part 502 comes in contact with the face of the wall part 116 facing toward the groove part 115, and is inserted into the groove part 115. The projecting part 502 has a wedge shape that is a right-angled triangle in a cross-sectional view. The part corresponding to the oblique side of the right-angled triangle comes in contact with the face of the wall part 116 facing toward to the groove part 115.

As illustrated in FIG. 5C, the lower surface of the punch 500 as described above, which has been aligned with the plate part 130B, is brought in contact with the surface of the plate part 130B. As the punch 500 is pressed downward in FIG. 5C, the part of the projecting part 502 corresponding to the oblique side comes in contact with the face of the wall part 116 facing toward to the groove part 115, so that the wall part 116 is bent to the left-hand side in FIG. 5C.

The punch 500 is pressed until the left-hand-side face of the wall part 116 comes in contact with the upper edge 130B1 along the perimeter of the plate part 130B. In this manner, the wall part 116 holds the upper edge 130B1 along the perimeter of the plate part 130B while the plate part 130A is press fit into the opening 120A.

As the manner described above, the plate 130 is secured in the frame member 110.

Figure 6:
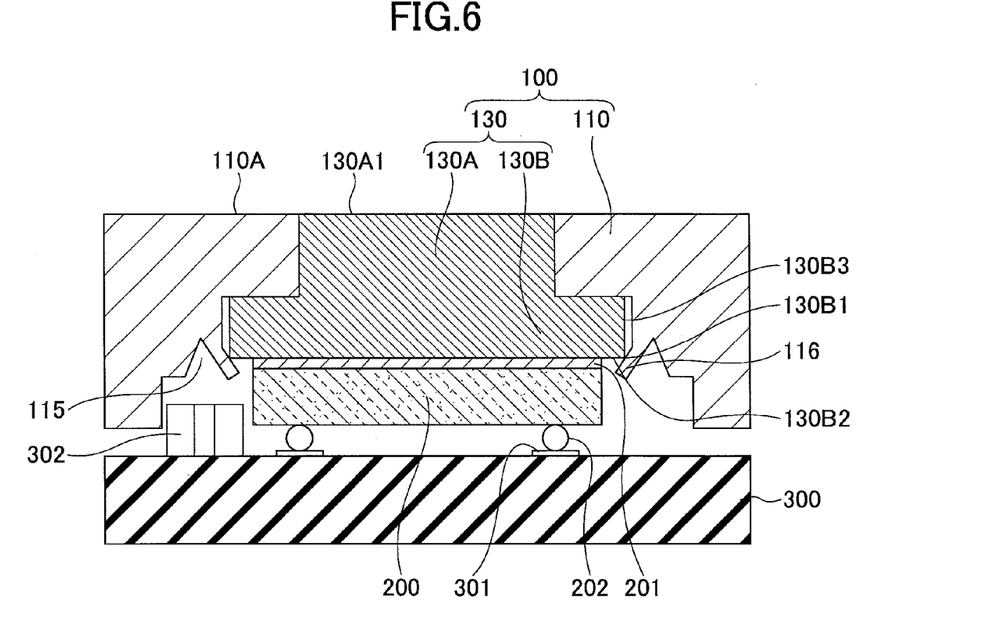
FIG. 6 is a drawing illustrating a configuration in which the heat sink of the embodiment is mounted on a semiconductor chip.

FIG. 6 is a drawing illustrating a configuration in which the heat sink 100 of the embodiment is mounted on a semiconductor chip 200. The heat sink 100 illustrated in FIG. 6 is vertically flipped relative to the heat sink 100 illustrated in FIGS. 4A and 4B. In FIG. 6, only some of the elements of the heat sink 100 are designated with reference numerals, and reference numerals for the other elements are omitted from illustration.

The heat sink 100 of the embodiment utilizes the plate 130 as a path for conducting heat. Due to this structure, the plate 130 is made of copper that has high thermal conductivity while the frame member 110 is made of stainless steel that has high strength and high spring property.

The reason why stainless steel, which is metallic material having high spring property, is used for the frame member 110 is as follows. There is a risk of having the plate 130 loosened or disconnected due to the difference in the thermal expansion coefficient between the frame member 110 and the plate 130 at the time of heating or cooling. The use of a metallic material having high elasticity (i.e., spring property) for the frame member 110 ensures that the wall part 116 reliably secures the plate 130 at the time of heating or cooling.

As illustrated in FIG. 6, the semiconductor chip 200 is connected via bumps 202 to interconnect lines 301 formed on the surface of an interconnection substrate 300. An electronic component 302 is also mounted on the interconnection substrate 300. The heat sink 100, the semiconductor chip 200, and the interconnection substrate 300 together constitute a semiconductor device.

The heat sink 100, which is vertically flipped relative to the heat sink 100 illustrated in FIGS. 4A and 4B, has the plate part 130B thereof adhering to the semiconductor chip 200 via thermally conductive material 201, thereby being thermally coupled to the semiconductor chip 200. The thermally conductive material 201 may be resin (e.g., silicone resin) containing a thermally conductive filler or indium, for example.

In this manner, the heat sink 100 is connected to the semiconductor chip 200 mounted on the interconnection substrate 300, thereby allowing the heat of the semiconductor chip 200 to be dissipated through the heat sink 100. A heat sink having heat dissipating fins or the like may be further attached to the heat sink 100 (i.e., to the surface 130A1 and the surface 110A) illustrated in FIG. 6.

It may be noted that the surface of the plate part 130B placed in contact with the semiconductor chip 200 (i.e., the lower surface thereof in FIG. 6) is not covered by the wall part 116. This is because the wall part 116 holds the upper edge 130B1 along the perimeter of the plate part 130B without covering the surface 130B2 (i.e., contact surface) that is placed in contact with the semiconductor chip 200. This arrangement ensures that sufficient area size for contact with the semiconductor chip 200 can be secured on the surface 130B2 (i.e., contact surface). In other words, the surface 130B2 (i.e., contact surface) of the plate part 130B is used for connection with the semiconductor chip 200, so that the heat sink 100 of the embodiment ensures the provision of sufficient area size for connection with the semiconductor chip 200.

According to the embodiment, thus, the heat sink 100 has sufficient contact area size for use in cooling the semiconductor chip 200, thereby being capable of efficiently cooling the semiconductor chip 200.

In recent years, the need for servers as data centers has been on the rise due to the widespread use of smartphone terminals, tablet-type computers, and the like. Because of this, CPUs (central processing units) used in servers are made to have a multicore module (i.e., MCM) configuration. To meet such a demand, complex structures are often used for heat sinks for cooling semiconductor chips such as CPUs, which makes it difficult to manufacture the heat sinks only by use of press work. In some cases, it may be required to utilize a structure in which a metallic plate having higher thermal conductivity than the heat sink is attached to an opening that is formed in the heat sink.

In such a case, the use of the heat sink 100 of the embodiment ensures that the wall part 116 securely holds the plate in the frame member 110 despite differences in the material and in the thermal expansion coefficient between the frame member 110 and the plate 130. Further, the area size of the plate 130 is not wasted. Accordingly, the heat sink 100 is provided that has sufficient contact area size for use in cooling the semiconductor chip 200, thereby being capable of efficiently cooling the semiconductor chip 200.

In the following, variations of the heat sink 100 of the embodiment will be described with reference to FIGS. 7A through 7C to FIGS. 11A and 11B.

Figure 7A:
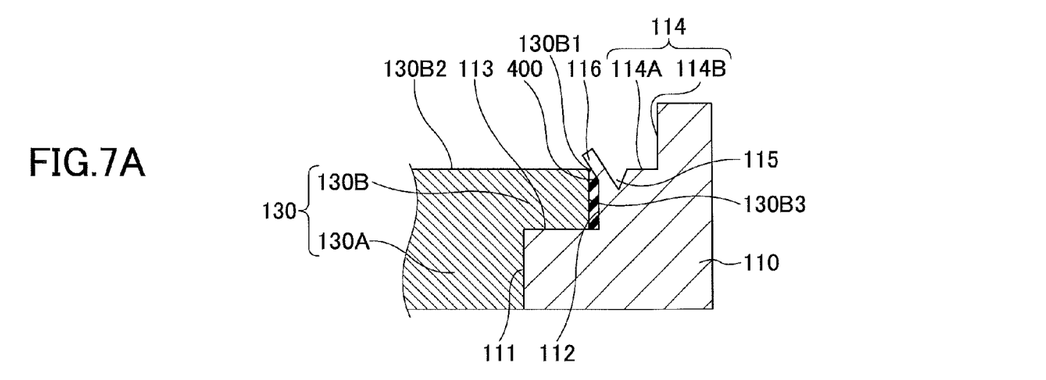
FIGS. 7A through 7C are drawings illustrating a variation of the heat sink of the embodiment.
Figure 7B:
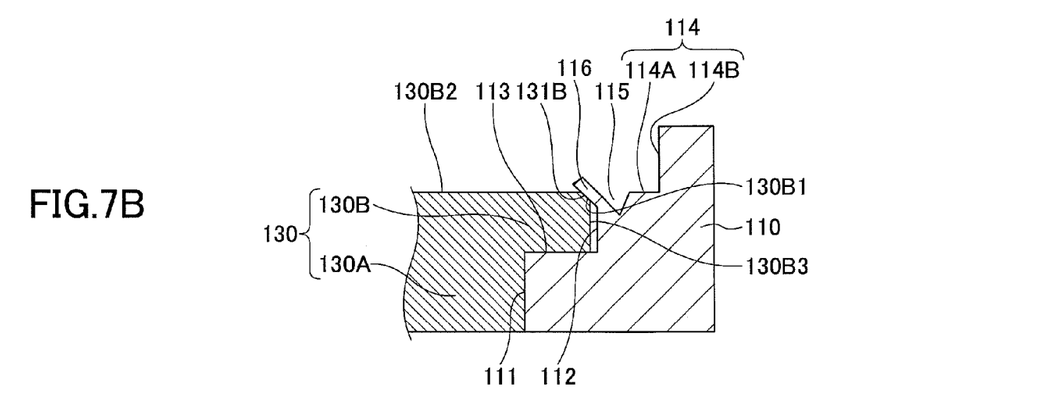
Figure 7C:
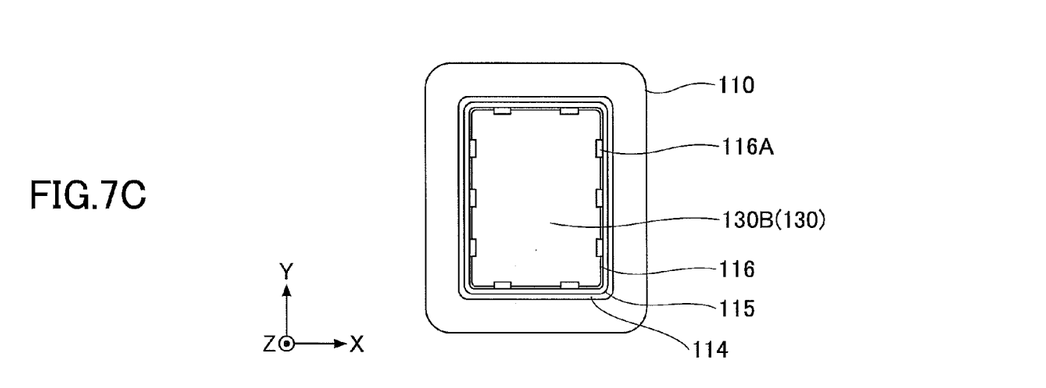

FIGS. 7A through 7C are drawings illustrating a variation of the heat sink 100 of the embodiment. Similarly to FIGS. 5A through 5C, FIGS. 7A and 7B illustrate the right-hand-side half of the cross-sections of the frame member 110 and the plate 130 illustrated in FIGS. 4A and 4B. FIG. 7C illustrates a plan view corresponding to what is illustrated in FIG. 1A.

As illustrated in FIG. 7A, filler 400 may be disposed in the gap between the inner circumferential surface 112 and the plate part 130B. The filler 400 may be elastic material such as solder, epoxy resin, silicone resin, or acrylic resin. The filler 400 may be applied to the inner circumferential surface 112 before the plate 130 is inserted into the opening 120.

The use of the filler 400 further improves the mounting strength of the plate 130 with respect to the frame member 110. There is a risk of having the plate 130 loosened or disconnected due to a difference in the thermal expansion coefficient caused by a difference in material between the frame member 110 and the plate 130 at the time of heating or cooling. The use of elastic material as the filler can reduce the risk of having the plate 130 loosened or disconnected.

As illustrated in FIG. 7B, a beveled part 131B may be formed in advance on the upper edge 130B1 along the perimeter of the plate part 130B. Upon being bent by the use of the punch 500 (see FIGS. 5A through 5C), the wall part 116 may come in contact with the beveled part 131B.

The fact that the wall part 116 is bent to be in contact with the beveled part 131B means that the size of the area of the contact between the frame member 110 and the plate part 130B can be increased. This further improves the mounting strength of the plate 130 with respect to the frame member 110. The size of the beveled part 131B may be determined such that a decrease in the area size of the plate part 130B for contact with a semiconductor chip does not become an issue.

FIG. 7C illustrates a variation of the wall part 116 illustrated in FIG. 1A. The wall part 116 is formed along the perimeter of the opening 120B in an annular rectangle shape, and has sections 116A thereof defined at constant intervals. Only these sections 116A are bent toward inside the opening 120B. It may be noted that only the portions of the wall part 116 at the four corners of the opening 120B may be bent toward inside.

The use of the configuration in which only the sections 116A disposed at constant intervals along the perimeter of the opening 120B are bent toward inside the opening 120B as illustrated in FIG. 7C makes it easier to inject the filler 400 (see FIG. 7A). In particular, it becomes possible to inject the filler 400 after the plate 130 is inserted into the frame member 110.

Figure 8A:
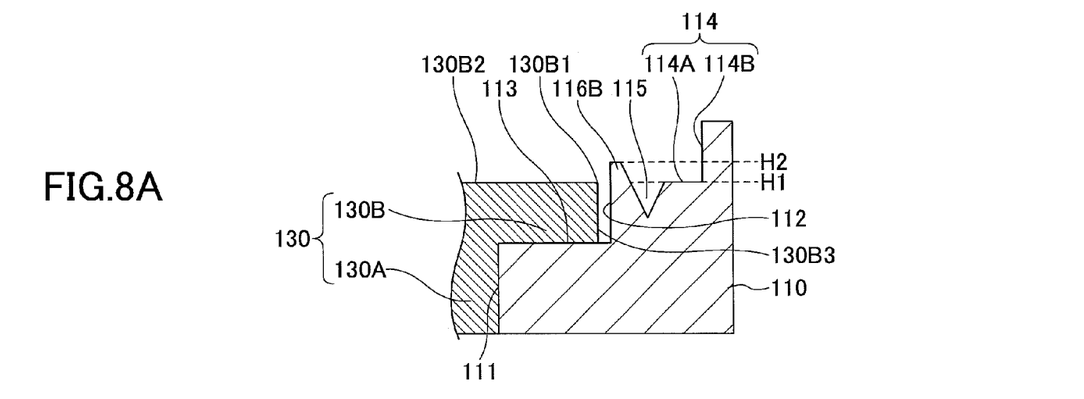
FIGS. 8A through 8C are drawings illustrating a variation of the heat sink of the embodiment.
Figure 8B:
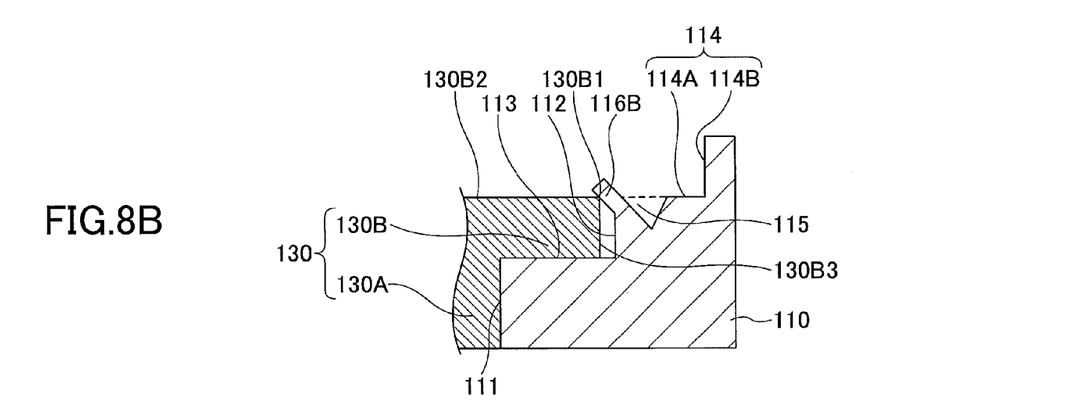
Figure 8C:
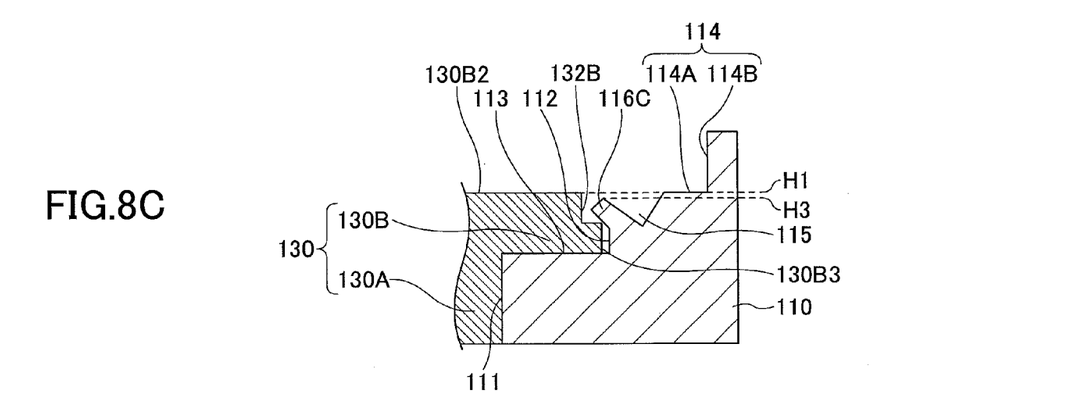

FIGS. 8A through 8C are drawings illustrating a variation of the heat sink 100 of the embodiment. Similarly to FIGS. 7A through 7C, FIGS. 8A through 8C illustrate only the right-hand-side half of the cross-sections of the frame member 110 and the plate 130 illustrated in FIGS. 4A and 4B.

As illustrated in FIG. 8A, the height of a wall part 116B of the frame member 110 may be set higher than the height of the bottom surface 114A of the recessed part 114. In FIG. 8A, the height of the bottom surface 114A is H1, and the height of the wall part 116B is H2. The height H2 is higher than the height H1.

This configuration allows the electronic component 302 (see FIG. 6) to have a higher height than otherwise when the electronic component 302 is disposed between the side surface 114B and the wall part 116B, thereby achieving efficient utilization of space.

The wall part 116B higher than the bottom surface 114A as illustrated in FIG. 8A may be formed as follows. The recessed part 114 is formed in a metal plate that is to be made into the frame member 110, followed by forming the groove part 115. In this state, the height of the bottom surface 114A and the height of the wall part 116B are both equal to H1. This is the height relationship between the bottom surface 114A and the wall part 116B illustrated in FIG. 4A.

With respect to the frame member 110 illustrated in FIG. 4A, the punch 500 that has a larger projecting part 502 (see FIGS. 5B and 5C) is used, such that pressing of the punch 500 causes the stainless steel around the groove part 115 to be gathered and turned into the wall part 116B while bending the wall part 116B. Forming of the wall part 116B in this manner causes the wall part 116B having the height H2 as illustrated in FIG. 8B to be created. The wall part 116B is illustrated in a bent state in FIG. 8B. If straightened upright, the wall part 116B formed in the manner described above would be the same as the wall part 116B having the height H2 from the beginning as illustrated in FIG. 8A.

As illustrated in FIG. 8C, a step constituted by a cut part 132B may be formed in the side surface 130B3 of the plate part 130B. A wall part 116C may be bent to engage with the step constituted by the cut part 132B. The cut part 132B may be formed by making a cut into the upper edge 130B1 (see FIG. 8A) along the perimeter of the plate part 130B at the surface 130B2, such that the step is created along the side surface 130B3 at the position of the upper edge 130B1 along the perimeter of the plate part 130B. With this arrangement, height H3 of the wall part 116C after being bent can be lower than the height H1 of the bottom surface 114A, which allows the mounted electronic component 302 to have greater height, thereby facilitating efficient utilization of space.

Figure 9A:
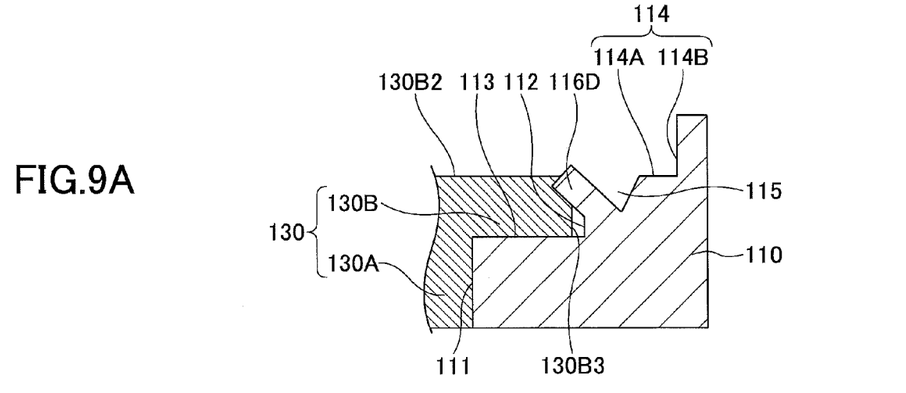
FIGS. 9A through 9C are drawings illustrating a variation of the heat sink of the embodiment.
Figure 9B:
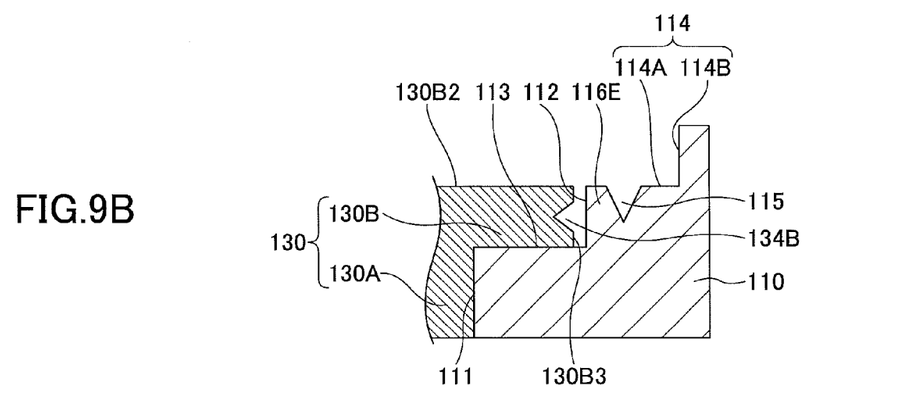
Figure 9C:
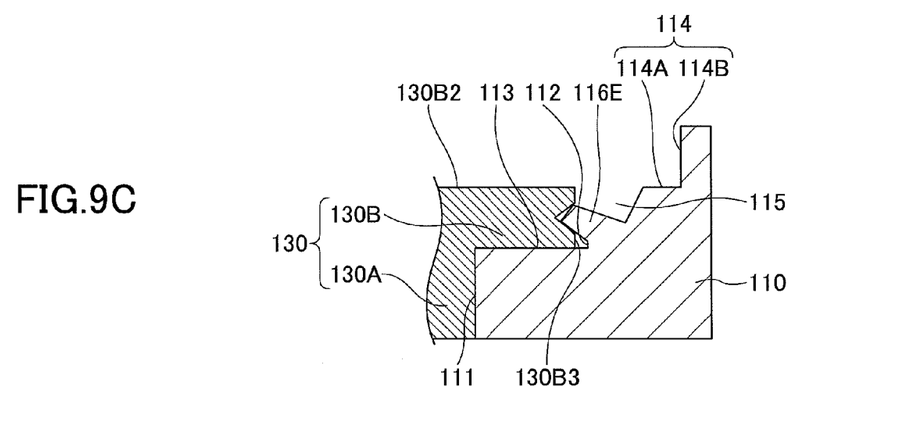

FIGS. 9A through 9C are drawings illustrating a variation of the heat sink 100 of the embodiment. Similarly to FIGS. 7A through 7C and FIGS. 8A through 8C, FIGS. 9A through 9C illustrate only the right-hand-side half of the cross-sections of the frame member 110 and the plate 130 illustrated in FIGS. 4A and 4B.

As illustrated in FIG. 9A, a wall part 116D may be made to dig into the side surface 130B3 of the plate part 130B. This arrangement further improves the mounting strength of the plate 130 with respect to the frame member 110. The configuration in which the wall part 116D is made to dig into the side surface 130B3 of the plate part 130B is an example of the configuration in which the wall part 116D is engaged with the side surface 130B3 of the plate part 130B.

As illustrated in FIG. 9B, an engagement groove part 134B may be formed in the side surface 130B3 of the plate part 130B. The tip of a wall part 116E may be engaged with the engagement groove part 134B as illustrated in FIG. 9C. This arrangement further improves the mounting strength of the plate 130 with respect to the frame member 110.

Figure 10A:
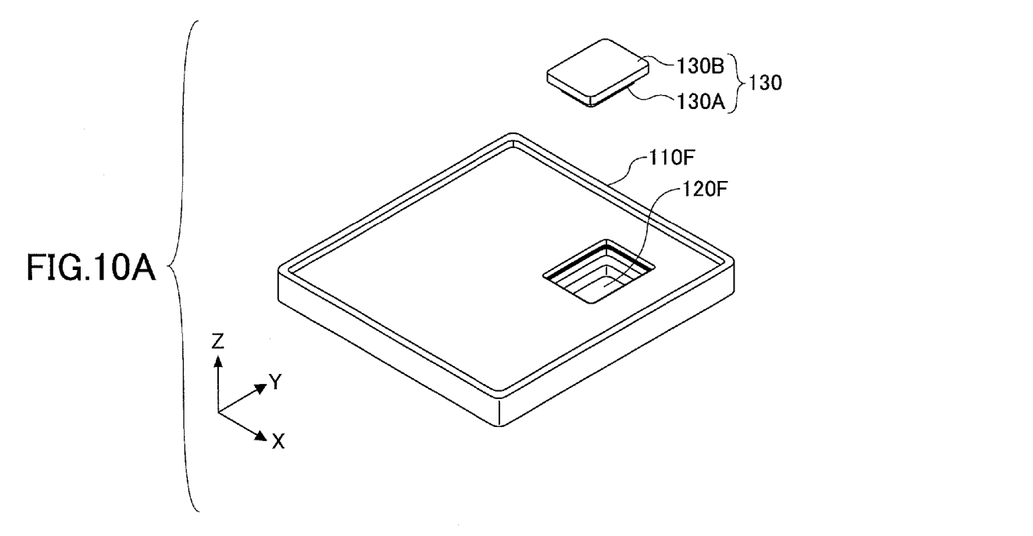
FIGS. 10A and 10B are oblique perspective views of a variation of the heat sink of the embodiment.
Figure 10B:
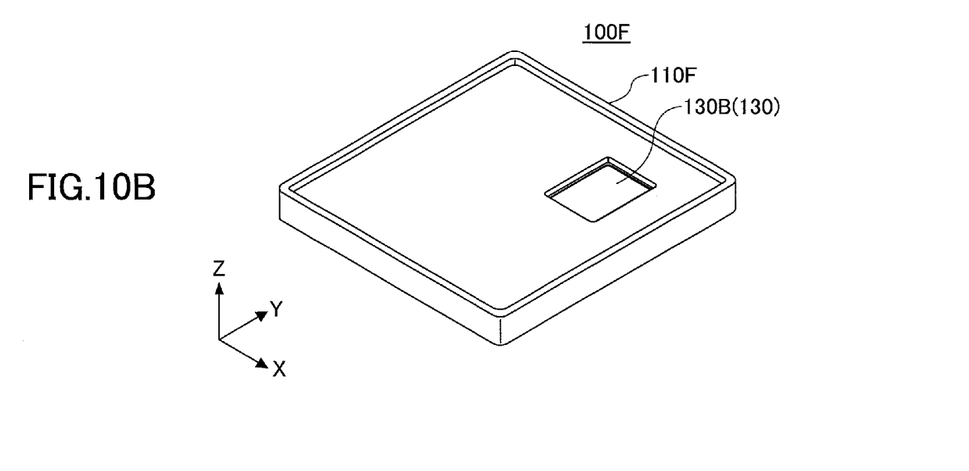
Figure 11A:
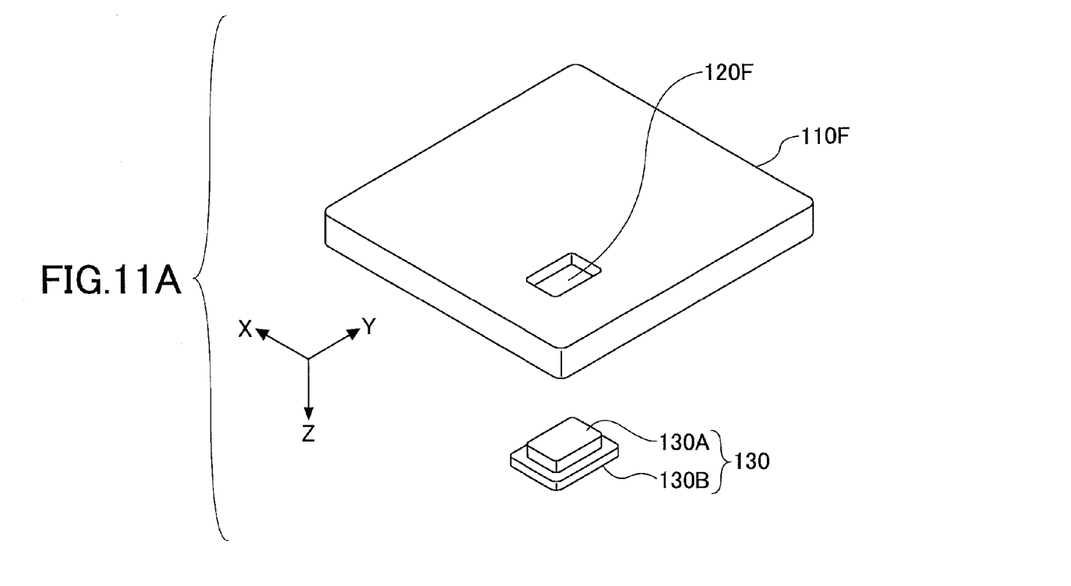
FIGS. 11A and 11B are oblique perspective views of a variation of the heat sink of the embodiment.
Figure 11B:
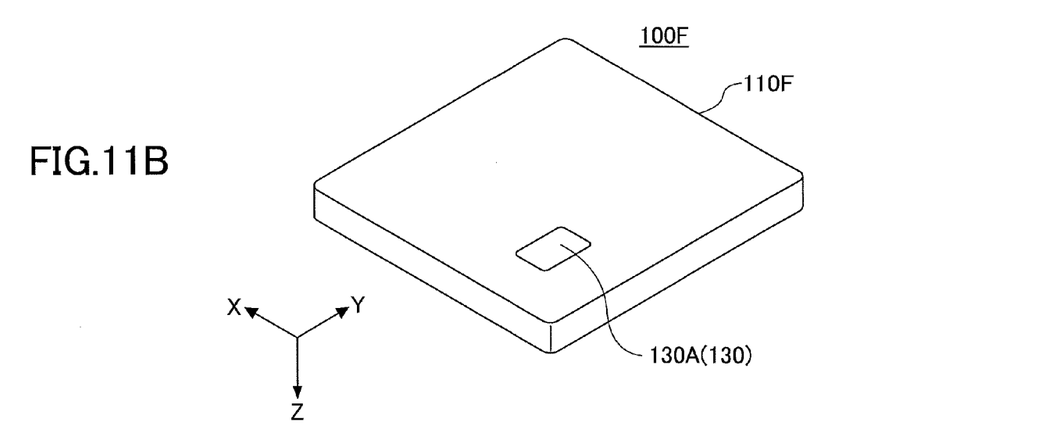

FIGS. 10A and 10B as well as FIGS. 11A and 11B are oblique perspective views of a variation of the heat sink of the embodiment. FIG. 10A and FIG. 11A are oblique perspective views illustrating the heat sink in an exploded view. FIG. 10B and FIG. 11B are oblique perspective views illustrating the heat sink in an assembled state.

A heat sink 100F illustrated in FIGS. 10A and 10B as well as FIGS. 11A and 11B includes a frame member 110F and the plate 130. The plate 130 is the same as or similar to the plate 130 illustrated in FIGS. 2A and 2B and in FIGS. 3A and 3B.

The frame member 110F has an opening 120F formed therein. The frame member 110F has the lengths thereof in the X-axis direction and the Y-axis direction longer than those of the frame member 110 illustrated in FIGS. 2A and 2B and in FIGS. 3A and 3B. The size of the opening 120F is the same as the size of the opening 120 illustrated in FIGS. 2A and 2B and in FIGS. 3A and 3B.

Namely, the relative size of the opening 120F to the entire frame member 110F is smaller than that of the frame member 110 illustrated in FIGS. 2A and 2B and in FIGS. 3A and 3B.

In this manner, the frame member 110F may be configured such that the opening 120F is formed only in a small part of the frame member 110F.

The descriptions of the heat sink and semiconductor device of exemplary embodiments have been provided heretofore. The present invention is not limited to these embodiments, but various variations and modifications may be made without departing from the scope of the present invention.

What is claimed is:

1. A heat sink, comprising:
   a frame member; and
   a plate member,
   wherein the frame member includes:
   a frame having an opening, the opening extending in a thickness direction of the frame from a first side of the frame to a second side of the frame, the opening having a first opening part situated toward the first side and a second opening part situated toward the second side, the second opening part being larger than the first opening part in a plan view perpendicular to the thickness direction of the frame;
   a wall standing on the frame on the second side at an edge of the opening; and
   a groove formed in the frame beside the wall on an opposite side of the wall from the opening side,
   wherein the plate member is disposed in the opening, and includes:
   a first plate part disposed in the first opening part; and
   a second plate part disposed in the second opening part and being larger than the first plate part in the plan view, and
   wherein the second opening part is larger than the second plate part in the plan view to leave a gap between an outer side surface of the second plate part and an inner surface of the second opening part, and the wall is bent toward the opening to be in contact with an edge along a perimeter of the second plate part.

2. The heat sink as claimed in claim 1, wherein the second plate part has an exposed surface exposed from the second opening part, the outer side surface, and the edge along the perimeter that is an intersection of the exposed surface and the outer side surface, wherein the wall is in contact with the edge along the perimeter only, without being in contact with any other part of the second plate part.

3. The heat sink as claimed in claim 1, wherein the edge along the perimeter is beveled, and the wall is in contact with the beveled edge.

4. The heat sink as claimed in claim 1, further comprising filler disposed in the gap.

5. The heat sink as claimed in claim 1, wherein the plate member includes a nickel plated layer formed on a surface thereof.

6. A semiconductor device, comprising:
   a heat sink;
   an interconnection substrate; and
   a semiconductor chip mounted on the interconnection substrate,
   wherein the heat sink includes:
   a frame member; and
   a plate member,
   wherein the frame member includes:
   a frame having an opening, the opening extending in a thickness direction of the frame from a first side of the frame to a second side of the frame, the opening having a first opening part situated toward the first side and a second opening part situated toward the second side, the second opening part being larger than the first opening part in a plan view perpendicular to the thickness direction of the frame;
   a wall standing on the frame on the second side at an edge of the opening; and
   a groove formed in the frame beside the wall on an opposite side of the wall from the opening side,
   wherein the plate member is disposed in the opening, and includes:
   a first plate part disposed in the first opening part; and
   a second plate part disposed in the second opening part and being larger than the first plate part in the plan view,
   wherein the second opening part is larger than the second plate part in the plan view to leave a gap between an outer side surface of the second plate part and an inner surface of the second opening part, and the wall is bent toward the opening to be in contact with an edge along a perimeter of the second plate part, and
   wherein a surface of the semiconductor chip opposite from the interconnection substrate is attached to a surface of the second plate part exposed from the second opening part.

7. The heat sink as claimed in claim 1, wherein the first plate part is disposed in the first opening part by press fitting.

8. The heat sink as claimed in claim 1, wherein the wall is defined by the inner surface of the second opening part and the groove.

* * * * *